(12) United States Patent
Mitsumori et al.

(10) Patent No.: US 10,665,432 B2
(45) Date of Patent: May 26, 2020

(54) TEMPERATURE CONTROL METHOD

(71) Applicant: Tokyo Electron Limited, Tokyo (JP)

(72) Inventors: Akiyoshi Mitsumori, Miyagi (JP); Shin Yamaguchi, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/390,113

(22) Filed: Apr. 22, 2019

(65) Prior Publication Data

US 2019/0326102 A1    Oct. 24, 2019

(30) Foreign Application Priority Data

Apr. 23, 2018  (JP) ................. 2018-082134

(51) Int. Cl.
*H01J 37/32* (2006.01)
*H01L 21/67* (2006.01)
*H01L 21/311* (2006.01)

(52) U.S. Cl.
CPC .. *H01J 37/32532* (2013.01); *H01J 37/32091* (2013.01); *H01L 21/31116* (2013.01); *H01L 21/67069* (2013.01); *H01J 2237/002* (2013.01); *H01J 2237/334* (2013.01); *H01J 2237/335* (2013.01)

(58) Field of Classification Search
CPC .......... H01J 37/32532; H01J 37/32091; H01J 2237/335; H01J 2237/002; H01J 2237/334; H01L 21/67069; H01L 21/31116; H01L 21/67103; H01L 21/67248; H01L 21/67109; G05D 23/20
See application file for complete search history.

(56) References Cited

U.S. PATENT DOCUMENTS

| | | | |
|---|---|---|---|
| 2006/0213763 A1* | 9/2006 | Furuya .............. | H01J 37/32009 204/192.1 |
| 2009/0044752 A1* | 2/2009 | Furuya .............. | C23C 16/45572 118/723 E |
| 2017/0092471 A1* | 3/2017 | Wakai ............... | H01J 37/32697 |
| 2018/0038620 A1* | 2/2018 | Seki .................. | H01J 37/32935 |

FOREIGN PATENT DOCUMENTS

JP    2017-011255 A    1/2017

* cited by examiner

*Primary Examiner* — Duy Vu N Deo
(74) *Attorney, Agent, or Firm* — Pearne & Gordon LLP

(57) ABSTRACT

A temperature control method includes cooling an upper electrode and increasing a temperature of the upper electrode. A path having an inlet and an outlet is formed within the upper electrode. The upper electrode constitutes an evaporator. A compressor, a condenser and an expansion valve are connected in sequence between the outlet and the inlet of the path. A flow dividing valve is connected between an output of the compressor and the inlet to bypass the condenser and the expansion valve. In the cooling of the upper electrode, a coolant is supplied into the path via the compressor, the condenser and the expansion valve. In the increasing of the temperature of the upper electrode, the flow dividing valve is opened and the upper electrode is heated.

17 Claims, 13 Drawing Sheets

TEMPERATURE CONTROL METHOD

CROSS-REFERENCE TO RELATED APPLICATION

This application claims the benefit of Japanese Patent Application No. 2018-082134 filed on Apr. 23, 2018, the entire disclosures of which are incorporated herein by reference.

TECHNICAL FIELD

The various aspects and embodiments described herein pertain generally to a temperature control method of an upper electrode of a plasma processing apparatus.

BACKGROUND

In the manufacture of an electronic device, a plasma processing is performed on a substrate. Plasma etching is known as one kind of such a plasma processing.

Described in Patent Document 1 is plasma etching as one kind of the plasma processing. In the plasma etching disclosed in Patent Document 1, plasma of a hydrogen-containing gas and a fluorine-containing gas is generated within a chamber to etch silicon oxide.

Patent Document 1 describes a capacitively coupled plasma processing apparatus as an apparatus used in the plasma etching. The capacitively coupled plasma processing apparatus is equipped with a chamber, a supporting table and an upper electrode. The supporting table is provided within the chamber. The supporting table includes a lower electrode. The upper electrode is provided above the supporting table. In the capacitively coupled plasma processing apparatus, the gas within the chamber is excited into plasma by a high frequency electric field formed between the upper electrode and the lower electrode.

Patent Document 1: Japanese Patent Laid-open Publication No. 2017-011255

The plasma processing apparatus may be required to cool components which form and confine a space within the chamber and to increase temperatures of these components in a short time. One of these components is the upper electrode.

SUMMARY

In an exemplary embodiment, there is provided a temperature control method of an upper electrode of a capacitively coupled plasma processing apparatus. The temperature control method includes cooling the upper electrode; and increasing a temperature of the upper electrode. A path having an inlet and an outlet is formed within the upper electrode, and the upper electrode constitutes an evaporator. A compressor, a condenser and an expansion valve are connected in sequence between the outlet and the inlet of the path. A flow dividing valve is connected between an output of the compressor and the inlet to bypass the condenser and the expansion valve. In the cooling of the upper electrode, a coolant is supplied into the path via the compressor, the condenser and the expansion valve. In the increasing of the temperature of the upper electrode, the flow dividing valve is opened and the upper electrode is heated.

In the temperature control method according to the exemplary embodiment, when cooling the upper electrode, the coolant is supplied into the path of the upper electrode via the compressor, the condenser and the expansion valve. As the coolant is vaporized within the path of the upper electrode, the upper electrode is cooled. Meanwhile, when increasing the temperature of the upper electrode, the flow dividing valve is opened. Since the coolant having high degree of dryness is supplied into the path in the state that the flow dividing valve is opened, an effect of removing the heat from the upper electrode by the coolant is deteriorated. Further, when increasing the temperature of the upper electrode, the upper electrode is heated. According to the temperature control method of the exemplary embodiment, since the effect of removing the heat from the upper electrode by the coolant is degraded and the upper electrode is heated when increasing the temperature of the upper electrode, it is possible to increase the temperature of the upper electrode in a short time.

In the increasing of the temperature of the upper electrode, the upper electrode may be heated by a heater. In the increasing of the temperature of the upper electrode, the upper electrode may be heated by heat from plasma which is generated within a chamber of the plasma processing apparatus.

The temperature control method further includes etching a film of a substrate by plasma generated in the chamber of the plasma processing apparatus; and generating a negative bias voltage in the upper electrode during the etching of the film. During the etching of the film of the substrate, the substrate is placed on a supporting table provided within a chamber. The supporting table is provided with a lower electrode. The temperature control method further includes generating plasma of a cleaning gas within the chamber to remove a deposit which is generated in the etching of the film and adheres to an inner wall surface of the chamber. The etching of the film of the substrate is performed during the cooling of the upper electrode. The increasing of the temperature of the upper electrode is performed prior to or during the generating of the plasma of the cleaning gas.

In the exemplary embodiment, since the negative bias voltage is generated in the upper electrode, positive ions in the plasma are accelerated toward the upper electrode. Further, during the etching of the film of the substrate, the upper electrode is being cooled. Accordingly, the amount of chemical species capable of etching the deposit is increased around the upper electrode, so that the deposit adhering to the upper electrode is efficiently etched. Thus, according to the present exemplary embodiment, the amount of the deposit adhering to the upper electrode is reduced, or the deposit is removed from the upper electrode. Further, when the plasma of the cleaning gas is generated, the temperature of the upper electrode is set to be high. Thus, the possibility that the deposit removed from the inner wall surface of the chamber by the plasma of the cleaning gas may adhere to the upper electrode is decreased.

The temperature control method further includes etching a film of a substrate by plasma generated in the chamber of the plasma processing apparatus; and generating a negative bias voltage in the upper electrode during the etching of the film. During the etching of the film of the substrate, the substrate is placed on a supporting table provided within a chamber. The supporting table is provided with a lower electrode. The temperature control method further includes forming a protective film on a surface of the substrate. The etching of the film of the substrate is performed during the cooling of the upper electrode. The increasing of the temperature of the upper electrode is performed prior to or during the forming of the protective film. The etching of the film of the substrate and the forming of the protective film are alternately performed.

In the exemplary embodiment, since the negative bias voltage is generated in the upper electrode, the positive ions in the plasma are accelerated toward the upper electrode. Further, during the etching of the film of the substrate, the upper electrode is being cooled. Accordingly, the amount of chemical species capable of etching the deposit is increased around the upper electrode, so that the deposit adhering to the upper electrode is efficiently etched. Thus, according to the present exemplary embodiment, the amount of the deposit adhering to the upper electrode is reduced, or the deposit is removed from the upper electrode. Further, during the forming of the protective film, the temperature of the upper electrode is set to be high. Accordingly, the possibility that the protective film may adhere to the upper electrode is reduced. Moreover, in the present exemplary embodiment, the protective film is formed on the sidewall surface forming and confining the opening formed at the film. Accordingly, the opening formed by the etching of the film is suppressed from being extended in the horizontal direction (direction orthogonal to the depth direction of the opening).

The film of the substrate contains silicon. In the etching of the film of the substrate, the plasma is generated from a processing gas including carbon, hydrogen and fluorine.

The film of the substrate may be a multilayered film. The multilayered film may include multiple silicon oxide films and multiple silicon nitride films alternately stacked on top of each other.

As stated above, it is possible to cool the upper electrode of the capacitively coupled plasma processing apparatus and, also, to increase the temperature of the upper electrode in a short time.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
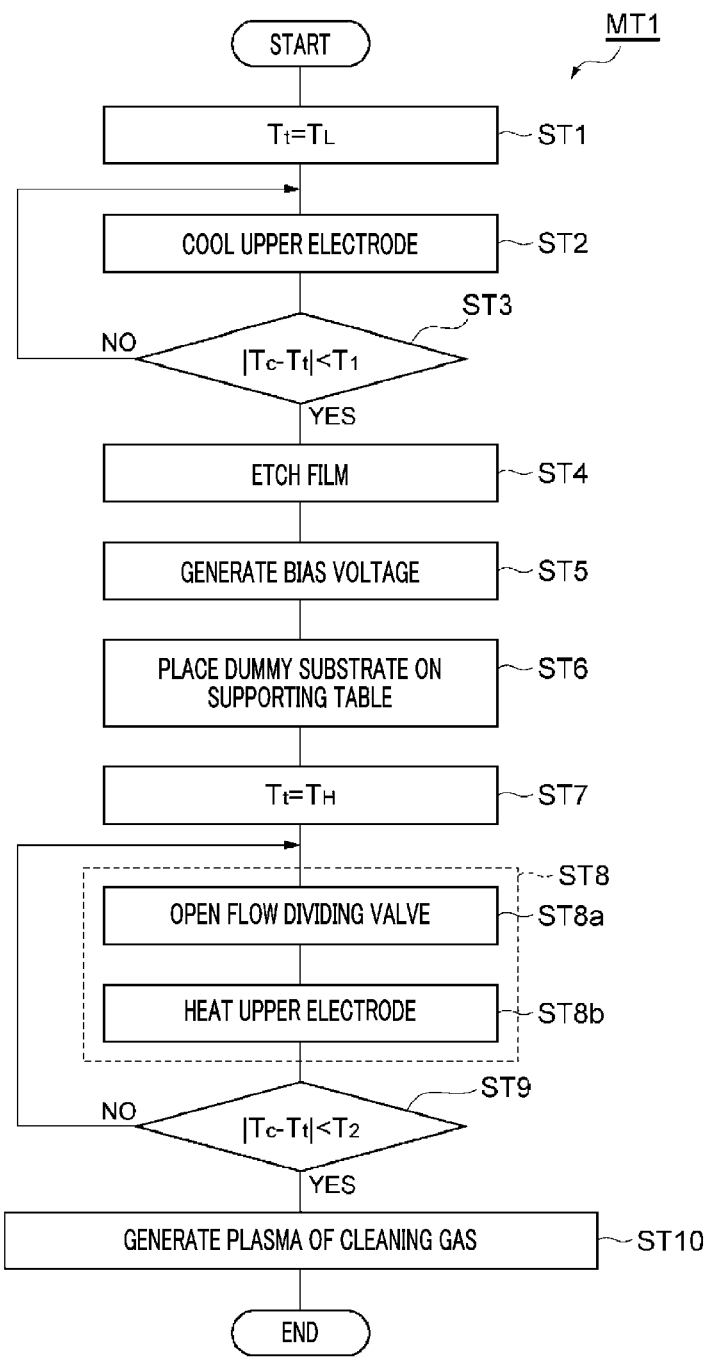
FIG. 1 is a flowchart illustrating a temperature control method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

Figure 2:
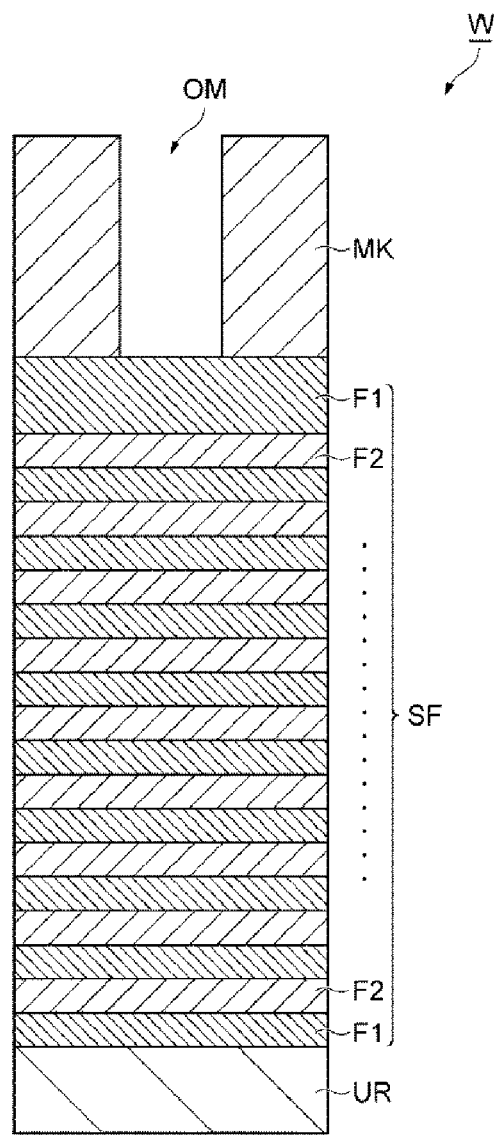
FIG. 2 is a partially enlarged cross sectional view of an example substrate.

FIG. 1 is a flowchart illustrating a temperature control method according to an exemplary embodiment. The temperature control method (hereinafter, referred to as "method MT1") shown in FIG. 1 includes cooling an upper electrode of a plasma processing apparatus and increasing a temperature of the upper electrode. Further, a film of a substrate may be etched in the method MT1. FIG. 2 is a partially enlarged cross sectional view illustrating an example of the substrate. A substrate W shown in FIG. 2 can be processed in the method MT1. The substrate W has a film SF. The film SF may be of any kind. As an example, the film SF contains silicon. By way of non-liming example, the film SF is a multilayered film. The multilayered film may include a plurality of first films F1 and a multiplicity of second films F2. The first films F1 and the second films F2 are alternately stacked on top of each other. By way of example, each of the first films F1 is a silicon oxide film, and each of the second films F2 is a silicon nitride film.

The substrate W may further include an underlying region UR and a mask MK. The film SF is provided on the underlying region UR. The mask MK is provided on the film SF. The mask MK is a patterned region. The mask MK provides a pattern to be transferred to the film SF. The mask MK is provided with one or more openings OM.

Figure 3:
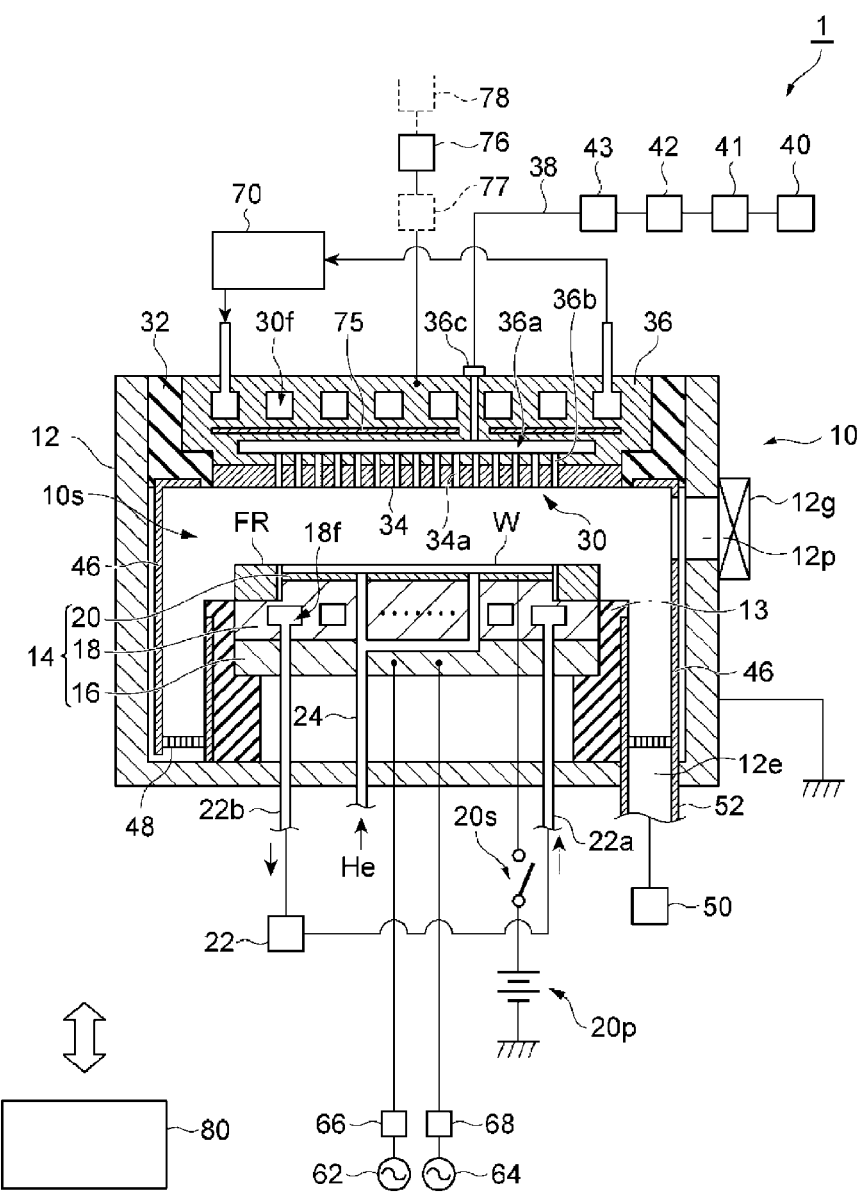
FIG. 3 is a diagram schematically illustrating an example plasma processing apparatus to which temperature control methods according to various exemplary embodiments can be applied.

The method MT1 is performed by using a plasma processing apparatus 1. FIG. 3 is a diagram schematically illustrating an example plasma processing apparatus to which temperature control methods according to various exemplary embodiments are applicable. The plasma processing apparatus 1 shown in FIG. 3 is a capacitively coupled plasma processing apparatus. The plasma processing apparatus 1 is equipped with a chamber 10. The chamber 10 has an internal space 10s therein.

The chamber 10 includes a chamber main body 12. The chamber main body 12 has a substantially cylindrical shape. The internal space 10s is provided within the chamber main body 12. The chamber main body 12 is made of, by way of example, but not limitation, aluminum. An inner wall surface of the chamber main body 12 is treated with a corrosion-resistant film. The corrosion-resistant film may be a film formed of ceramic such as aluminum oxide or yttrium oxide.

A passage 12p is formed at a sidewall of the chamber main body 12. The substrate W passes through the passage 12p when it is transferred between the internal space 10s and the outside of the chamber 10. The passage 12p is opened or closed by a gate valve 12g. The gate valve 12g is provided along the sidewall of the chamber main body 12.

A supporting member 13 is provided on a bottom portion of the chamber main body 12. The supporting member 13 is made of an insulating material. The supporting member 13 has a substantially cylindrical shape. Within the internal space 10s, the supporting member 13 is extended upwards from the bottom portion of the chamber main body 12. The supporting member 13 supports a supporting table 14. The supporting table 14 is provided within the internal space 10s. The supporting table 14 is configured to support the substrate W within the internal space 10s.

The supporting table 14 is equipped with a lower electrode 18 and an electrostatic chuck 20. The supporting table 14 may be further equipped with an electrode plate 16. The electrode plate 16 is made of a conductor such as, but not limited to, aluminum and has a substantially disk shape. The lower electrode 18 is provided on the electrode plate 16. The lower electrode 18 is made of a conductor such as, but not limited to, aluminum and has a substantially disk shape. The lower electrode 18 is electrically connected with the electrode plate 16.

The electrostatic chuck 20 is provided on the lower electrode 18. The substrate W is placed on a top surface of the electrostatic chuck 20. The electrostatic chuck 20 includes a main body and an electrode. The main body of the electrostatic chuck 20 is formed of a dielectric material. The electrode of the electrostatic chuck 20 is a film-shaped electrode and provided within the main body of the electrostatic chuck 20. The electrode of the electrostatic chuck 20 is connected to a DC power supply 20p via a switch 20s. If a voltage is applied to the electrode of the electrostatic chuck 20 from the DC power supply 20p, an electrostatic attracting force is generated between the electrostatic chuck 20 and substrate W. The substrate W is attracted to and held by the electrostatic chuck 20 by the generated electrostatic attracting force.

A focus ring FR is provided on a peripheral portion of the lower electrode 18 to surround an edge of the substrate W. The focus ring FR is configured to improve uniformity of a plasma processing upon the substrate W. The focus ring FR may be made of, but not limited to, silicon, silicon carbide or quartz.

A path 18f is formed within the lower electrode 18. A chiller unit 22 is provided at the outside of the chamber 10. The chiller unit 22 is configured to supply a heat exchange medium (for example, a coolant) into the path 18f via a pipeline 22a. The heat exchange medium supplied into the path 18f is returned back into the chiller unit 22 via a pipeline 22b. In the plasma processing apparatus 1, a temperature of the substrate W placed on the electrostatic chuck 20 is adjusted by a heat exchange between the heat exchange medium and the lower electrode 18.

The plasma processing apparatus 1 is equipped with a gas supply line 24. Through the gas supply line 24, a heat transfer gas (e.g., a He gas) from a heat transfer gas supply mechanism is supplied into a gap between the top surface of the electrostatic chuck 20 and a rear surface of the substrate W.

The plasma processing apparatus 1 is further equipped with an upper electrode 30. The upper electrode 30 is provided above the supporting table 14. The upper electrode 30 is supported at an upper portion of the chamber main body 12 with a member 32 therebetween. The member 32 is made of a material having insulation property. The upper electrode 30 and the member 32 close an upper opening of the chamber main body 12.

The upper electrode 30 may include a ceiling plate 34 and a supporting body 36. A bottom surface of the ceiling plate 34 is a surface directly facing the internal space 10s, and it forms and confines the internal space 10s. The ceiling plate 34 is formed of a conductor such as silicon or an insulator such as silicon oxide. The ceiling plate 34 is provided with multiple gas discharge holes 34a. These gas discharge holes 34a are formed through the ceiling plate 34 in a plate thickness direction.

The supporting body 36 is configured to support the ceiling plate 34 in a detachable manner, and is made of a conductive material such as, but not limited to, aluminum. A gas diffusion space 36a is provided within the supporting body 36. The supporting body 36 is provided with multiple gas holes 36b. The multiple gas holes 36b are extended downwards from the gas diffusion space 36a to communicate with the multiple gas discharge holes 34a, respectively. Further, the supporting body 36 is provided with a gas inlet port 36c. The gas inlet opening 36c is connected to the gas diffusion space 36a. A gas supply line 38 is connected to this gas inlet port 36c.

The gas supply line 38 is connected to a gas source group 40 via a valve group 41, a flow rate controller group 42 and a valve group 43. The gas source group 40 includes a plurality of gas sources. The plurality of gas sources belonging to the gas source group 40 include sources of a plurality of gases for use in the temperature control methods according to the various exemplary embodiments. The valve group 41 and the valve group 43 include a plurality of opening/closing valves. The flow rate controller group 42 includes a plurality of flow rate controllers. Each of the flow rate controllers belonging to the flow rate controller group 42 may be a mass flow controller or a pressure control type flow rate controller. Each of the gas sources belonging to the gas source group 40 is connected to the gas supply line 38 via a corresponding opening/closing valve belonging to the valve group 41, a corresponding flow rate controller belonging to the flow rate controller group 42 and a corresponding opening/closing valve belonging to the valve group 43.

In the plasma processing apparatus 1, a shield 46 is provided along the inner wall surface of the chamber main body 12 in a detachable manner. Further, the shield 46 is also provided on an outer side surface of the supporting member 13. The shield 46 is configured to suppress an etching byproduct from adhering to the chamber main body 12. The shield 46 may be made of, by way of non-limiting example, an aluminum base member having a corrosion-resistant film formed on a surface thereof. The corrosion-resistant film may be a film formed of ceramic such as yttrium oxide.

A baffle plate 48 is provided between the supporting member 13 and the sidewall of the chamber main body 12. The baffle plate 48 may be made of, by way of example, an aluminum base member having a corrosion-resistant film formed on a surface thereof. The corrosion-resistant film may be a film formed of ceramic such as yttrium oxide. The baffle plate 48 is provided with a plurality of through holes. A gas exhaust port 12e is provided at the bottom portion of the chamber main body 12 under the baffle plate 48. The gas exhaust port 12e is connected with a gas exhaust device 50 via a gas exhaust line 52. The gas exhaust device 50 has a pressure control valve and a vacuum pump such as a turbo molecular pump.

The plasma processing apparatus 1 is further equipped with a first high frequency power supply 62 and a second high frequency power supply 64. The first high frequency power supply 62 is configured to generate a first high frequency power. The first high frequency power has a frequency suitable for plasma generation. The frequency of the first high frequency power is in a range from, e.g., 27 MHz to 100 MHz. The first high frequency power supply 62 is connected to the lower electrode 18 via a matching device 66 and the electrode plate 16. The matching device 66 is equipped with a circuit configured to match an output impedance of the first high frequency power supply 62 and an impedance at a load side (lower electrode 18 side).

The second high frequency power supply 64 is configured to generate a second high frequency power. A frequency of the second high frequency power is lower than the frequency of the first high frequency power. When the first high frequency power and the second high frequency power are used together, the second high frequency power is used as a high frequency bias power for ion attraction into the substrate W. The frequency of the second high frequency power falls within a range from, e.g., 400 kHz to 13.56 MHz. The second high frequency power supply 64 is connected to the lower electrode 18 via a matching device 68 and the electrode plate 16. The matching device 68 is equipped with a circuit configured to match an output impedance of the second high frequency power supply 64 and the impedance at the load side (lower electrode 18 side).

Figure 4:
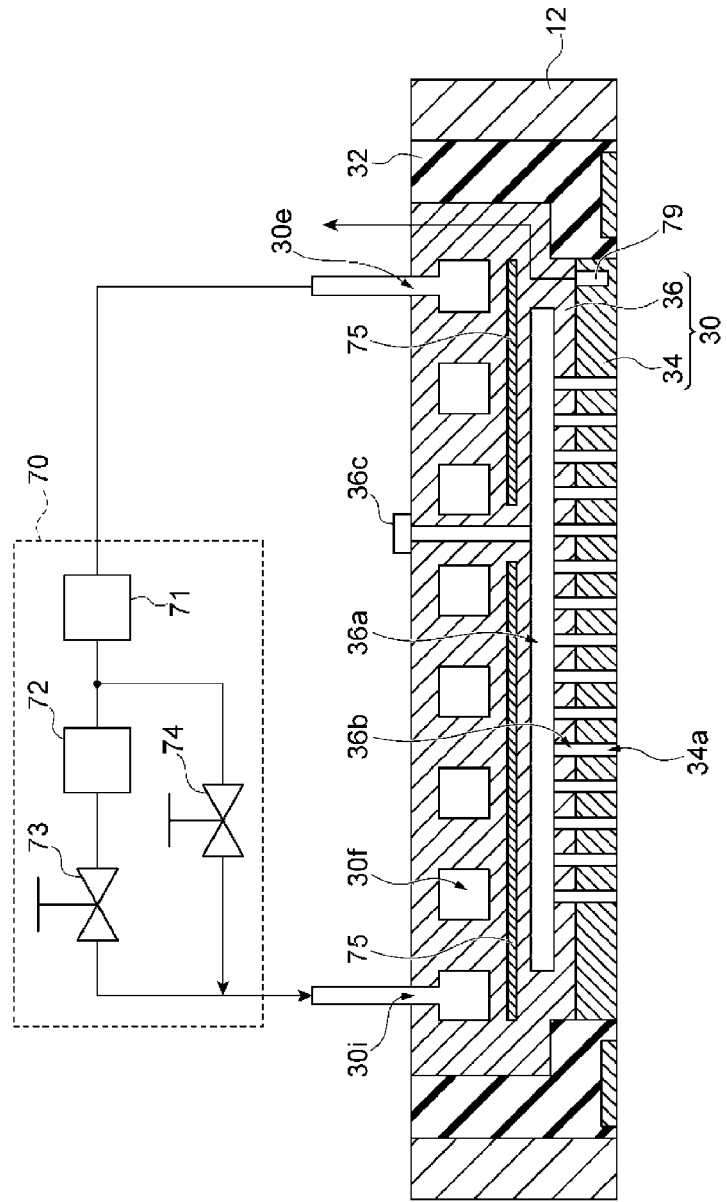
FIG. 4 is a diagram illustrating an example of an upper electrode and a chiller unit applicable to the example plasma processing apparatus shown in FIG. 3.

FIG. 4 is a diagram illustrating an example of the upper electrode and the chiller unit applicable to the example plasma processing apparatus shown in FIG. 3. Below, reference is made to FIG. 4 as well as FIG. 3. The upper electrode 30 is configured to be cooled.

By way of example, as depicted in FIG. 3 and FIG. 4, a path 30f is formed within the upper electrode 30. The path 30f has an inlet 30i and an outlet 30e, and is extended between the inlet 30i and the outlet 30e. The path 30f is formed within, for example, the supporting body 36. The path 30f is extended in a spiral shape within the upper electrode 30, for example.

A chiller unit 70 is provided at the outside of the chamber 10. An output port of the chiller unit 70 is connected to the inlet 30i. A return port of the chiller unit 70 is connected to the outlet 30e. The chiller unit 70 outputs the coolant from the output port thereof and supplies this coolant into the path 30f through the inlet 30i. The coolant supplied into the path 30f is returned back into the chiller unit 70 via the outlet 30e and the return port. That is, the coolant is circulated between the path 30f of the upper electrode 30 and the chiller unit 70.

The chiller unit 70 is of a direct expansion type. The chiller unit 70 has a compressor 71, a condenser 72 and an expansion valve 73. The compressor 71, the condenser 72 and the expansion valve 73 are connected in sequence between the outlet 30e and the inlet 30i of the path 30f. The upper electrode 30 constitutes an evaporator. An input of the compressor 71 is connected to the outlet 30e of the path 30f via the return port of the chiller unit 70. An output of the compressor 71 is connected to an input of the condenser 72. An output of the condenser 72 is connected to an input of the expansion valve 73. An output of the expansion valve 73 is connected to the inlet 30i of the path 30f via the output port of the chiller unit 70.

The coolant outputted from the outlet 30e of the path 30f is returned back to the input of the compressor 71 to be compressed by the compressor 71. The coolant having a high pressure outputted from the compressor 71 is cooled by the condenser 72 to be liquefied. The coolant of the liquid phase outputted from the condenser 72 is decompressed in the expansion valve 73. Then, the coolant supplied into the path 30f from the expansion valve 73 is vaporized by absorbing heat from the upper electrode 30. Then, the coolant outputted from the path 30f is returned back to the input of the compressor 71. An opening degree of the expansion valve 73 is variable. As the opening degree of the expansion valve 73 is lowered, the pressure of the coolant is lowered and the vaporization temperature is lowered. Accordingly, the upper electrode 30 can be cooled to a lower temperature.

The chiller unit 70 is further equipped with a flow dividing valve 74. The flow dividing valve 74 is connected between the compressor 71 and the inlet 30i of the path 30f to bypass the condenser 72 and the expansion valve 73. That is, an input of the flow dividing valve 74 is connected to the output of the compressor 71, and an output of the flow dividing valve 74 is connected to the inlet 30i of the path 30f. An opening degree of the flow dividing valve 74 is variable. With an increase of the opening degree of the flow dividing valve 74, the degree of dryness of the coolant supplied into the path 30f is increased. As the degree of dryness is higher, the heat removal effect of the coolant may be lower.

A heater 75 (resistance heating element) may be further provided within the upper electrode 30. By heating the upper electrode 30 by the heater 75, the upper electrode 30 can be set to have a higher temperature. Further, by heating the upper electrode 30 with the heater 75 while reducing the heat removal effect of the coolant by opening the flow dividing valve 74, it is possible to increase the temperature of the upper electrode 30 in a short period of time.

The plasma processing apparatus 1 may be further equipped with a temperature sensor 79. The temperature sensor 79 is configured to measure the temperature of the upper electrode 30 (for example, the ceiling plate 34). A sensor unit of the temperature sensor 79 may be provided within the upper electrode 30 (for example, the ceiling plate 34). The chiller unit 70 and the heater 75 are controlled to set the temperature of the upper electrode 30 to a designated temperature based on the temperature measured by the temperature sensor 79.

Further, the plasma processing apparatus 1 is configured to be capable of generating a bias voltage in the upper electrode 30. As depicted in FIG. 3, the upper electrode 30 (supporting body 36) is connected with a power supply 76. In case that the ceiling plate 34 is made of a conductor such as silicon, the power supply 76 is a DC power supply or a high frequency power supply. In case that the ceiling plate 34 is made of an insulator such as silicon oxide, on the other hand, the power supply 76 is a high frequency power supply. In case that the power supply 76 is the high frequency power supply, the power supply 76 is connected to the upper electrode 30 (supporting body 36) via a matching device 77. The matching device 77 is equipped with a circuit configured to match an output impedance of the power supply 76 and an impedance at a load side of the power supply 76 (upper electrode 30 side).

In case that the power supply 76 is the DC power supply, a current sensor 78 may be connected to the power supply 76. Alternatively, the power supply 76 may incorporate the current sensor 78 therein. The current sensor 78 is configured to measure an electric current flowing in the upper electrode 30.

The plasma processing apparatus 1 may be further equipped with a control unit 80. The control unit 80 may be a computer including a processor, a storage unit such as a memory, an input device, a display device, a signal input/output interface, and so forth. The control unit 80 controls the individual components of the plasma processing apparatus 1. In the control unit 80, an operator may input a command or the like through the input device to manage the plasma processing apparatus 1. Further, in the control unit 80, an operational status of the plasma processing apparatus 1 can be visually displayed by the display device. Furthermore, control programs and recipe data are stored in the storage unit of the control unit 80. The control programs are executed by the processor of the control unit 80 to allow various processings to be performed in the plasma processing apparatus 1. As the processor of the control unit 80 executes the control programs and controls the individual components of the plasma processing apparatus 1 based on the recipe data, the temperature control methods according to the various exemplary embodiments are performed in the plasma processing apparatus 1.

Figure 5:
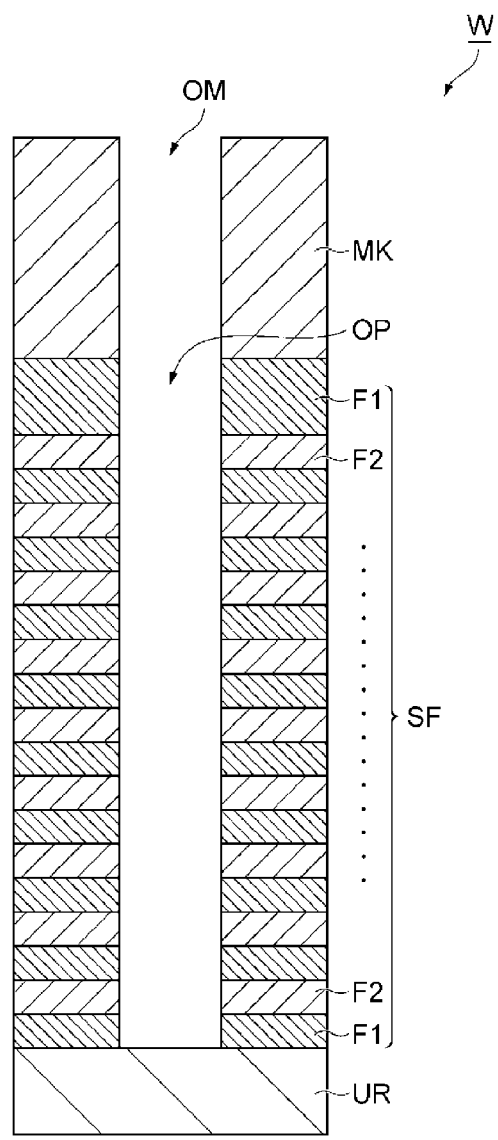
FIG. 5 is a partially enlarged cross sectional view illustrating a state of the example substrate after a film is etched in the method shown in FIG. 1.

Reference is made back to FIG. 1. The method MT1 will be described for an example case where the method MT1 is performed by using the plasma processing apparatus 1. In the following description, reference is made to FIG. 5 as well as FIG. 1. FIG. 5 is a partially enlarged cross sectional view illustrating a state of the example substrate after the etching of the film in the method shown in FIG. 1 is performed.

In the method MT1, a process ST1 is performed to set a target temperature $T_t$ of the upper electrode 30 to a temperature $T_L$. The temperature $T_L$ is a target temperature the upper electrode 30 needs to reach in a process ST2 and is a relatively low temperature. The temperature $T_L$ is equal to or less than, e.g., 50° C.

In the subsequent process ST2, the upper electrode 30 is cooled to the target temperature $T_t$. To elaborate, the coolant is supplied into the path 30f of the upper electrode 30 from the chiller unit 70. During the process ST2, the flow dividing valve 74 is kept closed. In the process ST2, the coolant is supplied into the path 30f via the compressor 71, the condenser 72 and the expansion valve 73. The coolant supplied into the path 30f is returned back into the compressor 71. In the process ST2, a degree of openness of the expansion valve 73 is set to allow the temperature of the upper electrode 30 to be set to the target temperature $T_t$. For example, the degree of openness of the expansion valve 73 is adjusted to reduce a difference between a temperature $T_C$ of the upper electrode 30 measured by the temperature sensor 79 and the target temperature $T_t$.

In a subsequent process ST3, it is determined whether an absolute value of the difference between the target temperature $T_t$ and the temperature $T_C$ of the upper electrode 30 is smaller than a preset value $T_1$. If it is determined in the process ST3 that the absolute value of the difference between the target temperature $T_t$ and the temperature $T_C$ of the upper electrode 30 is equal to or larger than the preset value $T_1$, the process ST2 is continuously performed. If, however, it is determined that the absolute value of the difference between the target temperature $T_t$ and the temperature $T_C$ of the upper electrode 30 is smaller than the preset value $T_1$, a process ST4 is performed.

In the process ST4, the film SF of the substrate W is etched. The process ST4 is performed during the process ST2. That is, while the cooling of the upper electrode 30 is being performed, the film SF is etched. In the process ST4, the film SF is etched by plasma generated within the chamber 10.

To elaborate, in the process ST4, a processing gas is supplied into the internal space 10s. The processing gas is supplied from one or more gas sources selected from the plurality of gas sources belonging to the gas source group 40. The processing gas is a gas for etching the film SF. In the process ST4, the gas exhaust device 50 is controlled such that a pressure within the internal space 10s is set to a predetermined pressure. In the process ST4, the chiller unit 22 is controlled such that a temperature of the supporting table 14 is set to a preset temperature. In the process ST4, the first high frequency power is supplied to generate plasma of the processing gas. In the process ST4, the second high frequency power may be further supplied.

In the exemplary embodiment, the film SF contains silicon as stated above. In the process ST2 of the present exemplary embodiment, the processing gas contains carbon, hydrogen and fluorine. The processing gas may be a mixed gas including a carbon-containing gas, one or more hydrogen-containing gases and one or more fluorine-containing gases. The processing gas may include a hydrogen gas ($H_2$ gas) as the hydrogen-containing gas. The processing gas may include, as the one or more fluorine-containing gases, one or more gases in hydrofluorocarbon gas, fluorocarbon gas, nitrogen trifluoride gas and sulfur hexafluoride gas. The processing gas may further include, as the carbon-containing gas, hydrocarbon gas.

In the process ST4, the film SF is etched by chemical species such as ions and/or radicals from the plasma of the processing gas. Through the process ST4, the pattern of the mask MK is transferred to the film SF. That is, as a result of the process ST4, an opening OP continuous with the one or more openings OM is formed in the film SF, as depicted in FIG. 5. During the process ST4, an etching byproduct is generated and adheres to the wall surface forming the internal space 10s to become a deposit. The deposit also adheres to the ceiling plate 34 of the upper electrode 30.

In the method MT1, a process ST5 is performed during the process ST4 to reduce the amount of the deposit on the ceiling plate 34 of the upper electrode 30 or to remove the deposit from the ceiling plate 34 of the upper electrode 30. That is, the process ST5 is performed during the process ST2. In the process ST5, a negative bias voltage is generated in the upper electrode 30.

In case that the power supply 76 is the DC power supply, the negative DC voltage is applied to the upper electrode 30 from the power supply 76 in the process ST5. In case that the power supply 76 is the high frequency power supply, on the other hand, the high frequency power is applied to the upper electrode 30 from the power supply 76 in the process ST5 to generate the negative bias voltage (self-bias voltage Vdc) in the upper electrode 30.

In the method MT1, the process ST5 is performed during the etching of the film SF (during the process ST4). Accordingly, the negative bias voltage is generated in the upper electrode 30 during the process ST4, so that positive ions in the plasma are accelerated toward the upper electrode 30. Further, in the process ST4, the upper electrode 30 is being cooled. Accordingly, the amount of the chemical species capable of etching the deposit is increased around the upper electrode 30, so that the deposit adhering to the upper electrode 30 is efficiently etched. Thus, according to the method MT1, the amount of the deposit attached to the upper electrode 30 is reduced, or the deposit is removed from the upper electrode 30.

Figure 6:
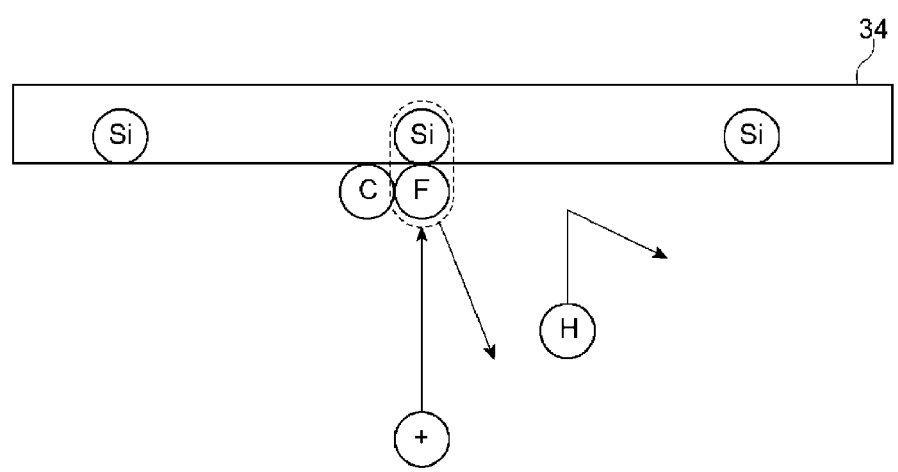
FIG. 6 is a diagram illustrating an example reaction of chemical species related to removal of a deposit on the upper electrode when a temperature of the upper electrode is relatively high.
Figure 7:
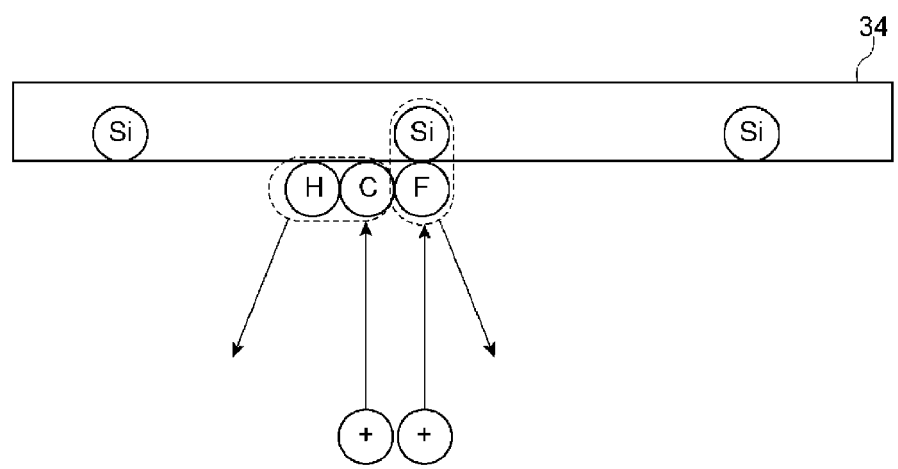
FIG. 7 is a diagram illustrating an example reaction of chemical species related to the removal of the deposit on the upper electrode when the temperature of the upper electrode is relatively low.

FIG. 6 is a diagram illustrating an example reaction of chemical species related to the removal of the deposit on the upper electrode in case that the temperature of the upper electrode is relatively high. FIG. 7 is a diagram illustrating an example reaction of chemical species related to the removal of the deposit on the upper electrode in case that the temperature of the upper electrode is relatively low. In FIG. 6 and FIG. 7, encircled 'Si' represents silicon. In FIG. 6 and FIG. 7, encircled 'C' indicates carbon. In FIG. 6 and FIG. 7, encircled 'F' represents fluorine. In FIG. 6 and FIG. 7, encircled 'H' indicates a hydrogen compound. In FIG. 6 and FIG. 7, encircled '+' represents positive ions. Below, referring to FIG. 6 and FIG. 7, an example case where the ceiling plate 34 of the upper electrode 30 contains silicon and the processing gas used in the process ST4 contains hydrogen, fluorine and carbon is considered.

If the processing gas used in the process ST4 includes hydrogen, fluorine and carbon, chemical species containing carbon and fluorine adheres to the ceiling plate 34 of the upper electrode 30 as the deposit, as shown in FIG. 6 and FIG. 7. In the state that the negative bias voltage is generated in the upper electrode 30, the positive ions are attracted toward the upper electrode 30 from the plasma, as illustrated in FIG. 6 and FIG. 7. The silicon of the ceiling plate 34 and the fluorine in the deposit are made to react with each other by energy of the positive ions attracted to the upper electrode 30, so that silicon fluoride is generated. The generated silicon fluoride is exhausted away from the upper electrode 30. As a result, the amount of the fluorine in the deposit is reduced.

If the temperature of the upper electrode 30 is relatively high, kinetic energy of the hydrogen compound is high, and the amount of the hydrogen compound adhering to the upper electrode 30 and/or the deposit is decreased. As a result, as shown in FIG. 6, the carbon in the deposit is left on the surface of the ceiling plate 34. Meanwhile, in the state that the upper electrode 30 is cooled through the process ST2, the kinetic energy of the hydrogen compound is reduced, and the amount of the hydrogen compound adhering to the upper electrode 30 and/or the deposit is increased. The carbon in the deposit and the hydrogen compound (or the hydrogen in the hydrogen compound) react with each other by the energy of the positive ions attracted to the upper electrode 30, so that hydrocarbon is generated, as shown in FIG. 7. The generated hydrocarbon is exhausted away from the upper electrode 30. As a result, the amount of the carbon in the deposit is reduced. Thus, by performing the process ST4 in the state that the upper electrode 30 is cooled and the negative bias voltage is generated in the upper electrode 30, the amount of the deposit adhering to the upper electrode 30 is reduced or the deposit is removed from the upper electrode 30.

Referring back to FIG. 1, the deposit may adhere to the inner wall surface of the chamber 10 as a result of performing the process ST4. The inner wall surface of the chamber 10 includes, by way of example, the inner wall surface of the chamber main body 12 and/or a surface of the shield 46. In the method MT1, plasma cleaning is performed in a process ST10 to remove the deposit adhering to the inner wall surface of the chamber 10. In the method MT1, the temperature of the upper electrode 30 is increased after performing the process ST4 to reduce a possibility that the deposit removed from the inner wall surface of the chamber 10 in the process ST10 may adhere to the upper electrode 30 again.

In the method MT1, in a process ST6, the substrate W on the supporting table 14 is carried out of the chamber 10, and a dummy substrate is placed on the supporting table 14. In a subsequent process ST7, the target temperature $T_t$ of the upper electrode 30 is set to a temperature $T_H$. The temperature $T_H$ is a target temperature the upper electrode 30 needs to reach in a process ST8 to be described later and is a relatively high temperature.

In the subsequent process ST8, the temperature of the upper electrode 30 is raised to the target temperature $T_t$. The process ST8 includes a process ST8*a* and a process ST8*b*. In the process ST8*a*, the flow dividing valve 74 is opened. The degree of openness of the flow dividing valve 74 may be previously set. Alternatively, the degree of openness of the flow dividing valve 74 is adjusted so that the temperature of the upper electrode 30 is set to the target temperature $T_t$. By way of example, the degree of openness of the flow dividing valve 74 is adjusted to reduce the difference between the temperature $T_C$ of the upper electrode 30 measured by the temperature sensor 79 and the target temperature $T_t$.

In the subsequent process ST8*b*, the upper electrode 30 is heated. The upper electrode 30 may be heated by the heater 75. Alternatively or in addition to the heating by the heater 75, plasma of an inert gas may be generated within the internal space 10*s* in the process ST8*b*. The inert gas is supplied from the gas source group 40. The inert gas may be, by way of example, a rare gas. In case that the plasma is generated in the process ST8*b*, the gas exhaust device 50 is controlled such that the pressure within the internal space 10*s* is set to a predetermined pressure. In case that the plasma is generated in the process ST8*b*, the first high frequency power is supplied. The second high frequency power may be further supplied. In case that the plasma is generated in the process ST8*b*, heat from the plasma is transferred to the upper electrode 30, so that the temperature of the upper electrode 30 is increased.

In a subsequent process ST9, it is determined whether the absolute value of the difference between the target temperature $T_t$ and the temperature $T_C$ of the upper electrode 30 is smaller than a preset value $T_2$. If it is determined in the process ST9 that the absolute value of the difference between the target temperature $T_t$ and the temperature $T_C$ of the upper electrode 30 is equal to or larger than the preset value $T_2$, the process ST8 is continuously performed. Meanwhile, if it is determined that the absolute value of the difference between the target temperature $T_t$ and the temperature $T_C$ of the upper electrode 30 is smaller than the preset value $T_2$, the process ST10 is performed. The process ST10 may be performed in parallel with the process ST8.

In the process ST10, to remove the deposit adhering to the inner wall surface of the chamber 10, the plasma cleaning is performed. In the process ST10, a cleaning gas is supplied into the internal space 10s. The cleaning gas is supplied from the gas source group 40. The cleaning gas may be any gas capable of removing the deposit adhering to the inner wall surface of the chamber 10. As an example, the cleaning gas includes a fluorocarbon gas. As an example, the cleaning gas may further include an oxygen gas and/or a rare gas. In the process ST10, the gas exhaust device 50 is controlled such that the pressure within the internal space 10s is set to a predetermined pressure. In the process ST10, the first high frequency power is supplied. The second high frequency power may be further supplied. In the process ST10, the deposit on the inner wall surface of the chamber 10 is etched by chemical species from plasma of the cleaning gas to be exhausted. After performing the process ST10, the method MT1 is ended.

In the method MT1, when the upper electrode 30 is cooled in the process ST2, the coolant is supplied into the path 30f of the upper electrode 30 via the compressor 71, the condenser 72 and the expansion valve 73. As the coolant is vaporized within the path 30f of the upper electrode 30, the upper electrode 30 is cooled. Meanwhile, when increasing the temperature of the upper electrode 30 in the process ST8, the flow dividing valve 74 is opened (process ST8a). Since the coolant having high degree of dryness is supplied into the path 30f in the state that the flow dividing valve 74 is opened, an effect of removing the heat from the upper electrode 30 by the coolant is degraded. Furthermore, when increasing the temperature of the upper electrode 30 in the process ST8, the upper electrode 30 is heated (process ST8b). According to the method MT1, since the effect of removing the heat from the upper electrode 30 by the coolant is weakened and the upper electrode 30 is heated when increasing the temperature of the upper electrode 30, it is possible to raise the temperature of the upper electrode 30 in a short time.

In the exemplary embodiment, when the plasma of the cleaning gas is generated (process ST10), the temperature of the upper electrode 30 is set to be high. Accordingly, the possibility that the deposit removed from the inner wall surface of the chamber 10 by the plasma of the cleaning gas may adhere to the upper electrode 30 is reduced.

Figure 8:
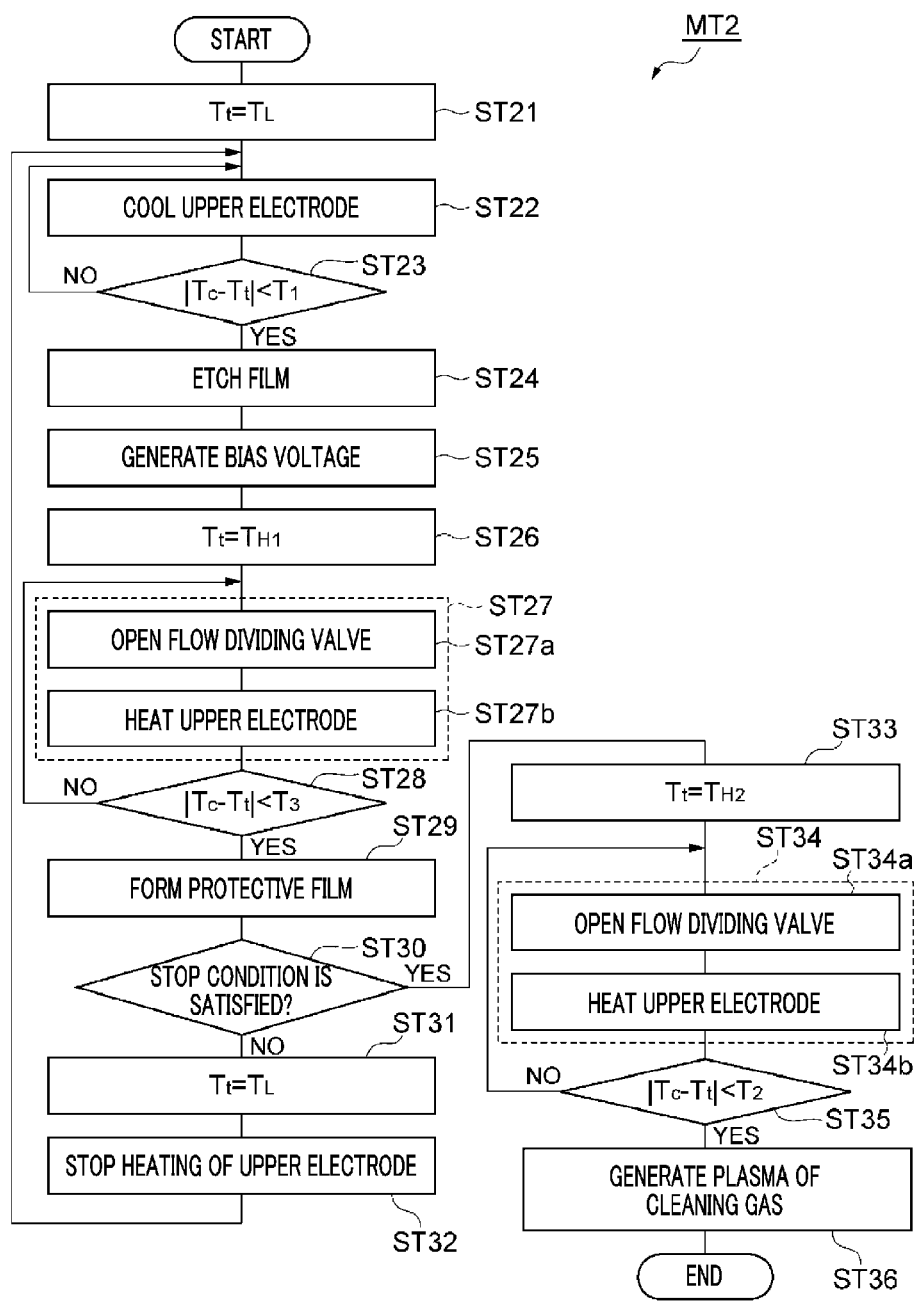
FIG. 8 is a diagram illustrating a temperature control method according to another exemplary embodiment.

Now, referring to FIG. 8, a temperature control method according to another exemplary embodiment will be explained. FIG. 8 is a flowchart illustrating the temperature control method according to another exemplary embodiment. The temperature control method (hereinafter, referred to as "method MT2") shown in FIG. 8 includes cooling the upper electrode of the plasma processing apparatus and increasing the temperature of the upper electrode. As in the method MT1, the film of the substrate can be etched in the method MT2. Below, the method MT2 will be explained for an example case where the film SF of the substrate W shown in FIG. 2 is etched by using the plasma processing apparatus 1. Further, the substrate having the film to be etched in the method MT2 is not limited to the substrate shown in FIG. 2 and may have a film of any type.

A process ST21 to a process ST25 of the method MT2 are the same as the process ST1 to the process ST5 of the method MT1, respectively. In the method MT2, etching in the process ST24 and protective film formation in the process ST29 are alternately performed. That is, in the method MT2, the etching of the film SF and the formation of a protective film on the surface of the substrate W are alternately performed.

To suppress the protective film from being formed on the upper electrode 30 (the ceiling plate 34) during the formation of the protective film in the process ST29, the temperature of the upper electrode 30 is increased prior to the process ST29 or during the process ST29 in the method MT2.

In the method MT2, the target temperature $T_t$ of the upper electrode 30 is set to a temperature $T_{H1}$ in a process ST26. The temperature $T_{H1}$ is a target temperature the upper electrode 30 needs to reach in a process ST27 to be described later and is a relatively high temperature.

In the subsequent process ST27, the temperature of the upper electrode 30 is raised to the target temperature $T_t$. The process S27 includes a process ST27a and a process ST27b. In the process ST27a, the flow dividing valve 74 is opened. The degree of openness of the flow dividing valve 74 may be previously set. Alternatively, the degree of openness of the flow dividing valve 74 may be set to allow the temperature of the upper electrode 30 to be set to the target temperature $T_t$. By way of example, the degree of openness of the flow dividing valve 74 is adjusted to reduce a difference between the temperature $T_C$ of the upper electrode 30 measured by the temperature sensor 79 and the target temperature $T_t$.

In a subsequent process ST27b, the upper electrode 30 is heated. The upper electrode 30 may be heated by the heater 75. Alternatively or in addition to the heating by the heater 75, plasma of an inert gas may be generated within the internal space 10s in the process ST27b. The inert gas is supplied from the gas source group 40. The inert gas may be, by way of example, but not limitation, a rare gas. When the plasma is generated in the process ST27b, the gas exhaust device 50 is controlled such that the pressure within the internal space 10s is regulated to a predetermined pressure. When the plasma is generated in the process ST27b, the first high frequency power is supplied. When the plasma is generated in the process ST27b, heat from the plasma is transferred to the upper electrode 30, so that the temperature of the upper electrode 30 is increased.

Figure 9:
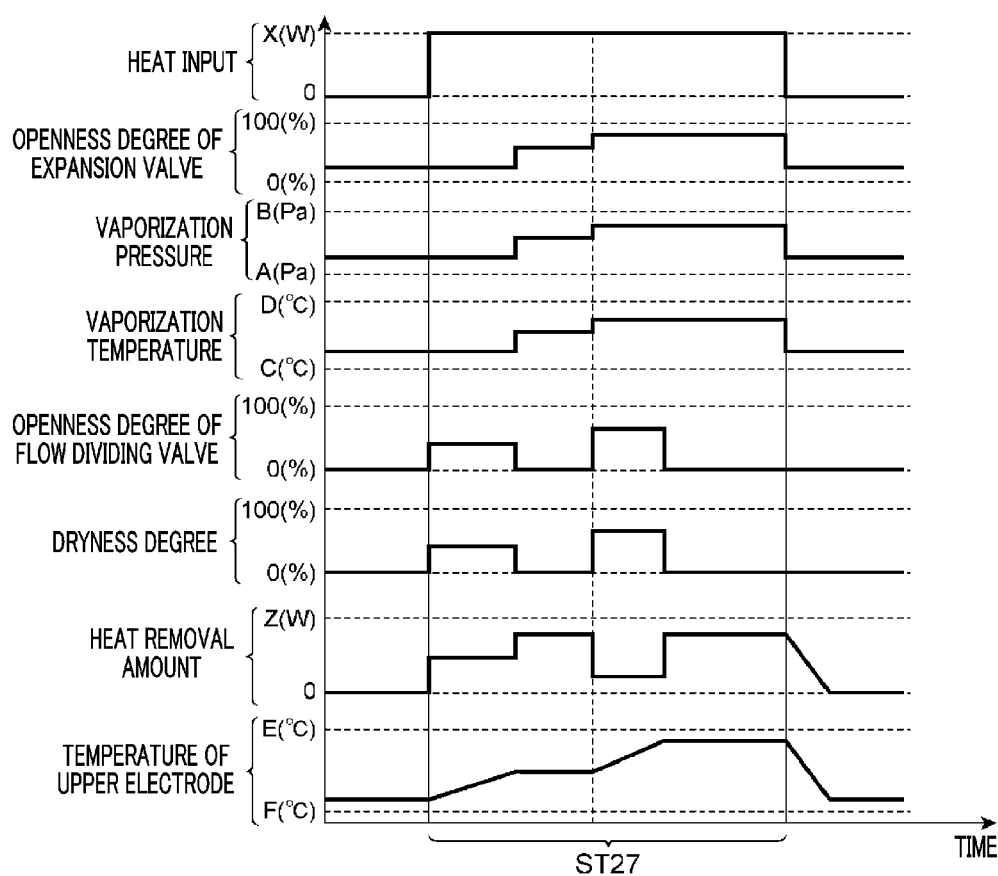
FIG. 9 is a diagram illustrating an example timing chart related to the method shown in FIG. 8.
Figure 10:
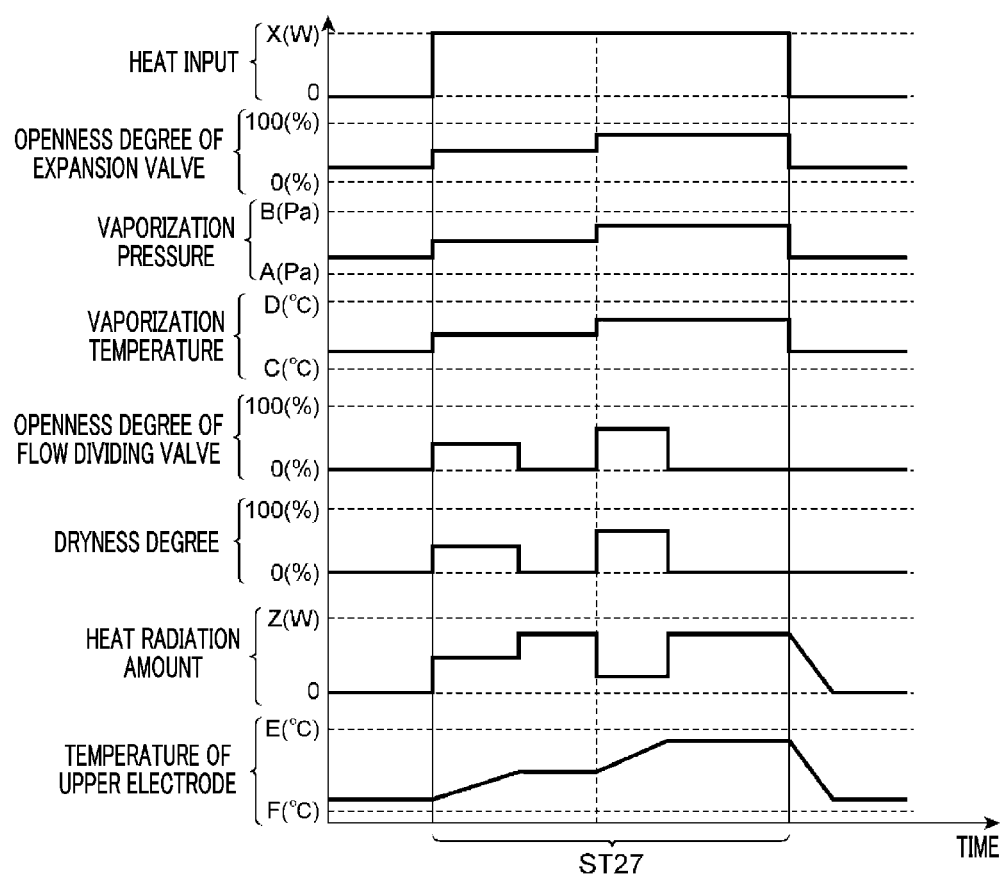
FIG. 10 is a diagram illustrating another example timing chart related to the method shown in FIG. 8.

FIG. 9 and FIG. 10 provide example timing charts regarding the method shown in FIG. 8. In FIG. 9 and FIG. 10, a horizontal axis represents time. In FIG. 9 and FIG. 10, "heat input" on a vertical axis indicates heat input to the upper electrode 30. The heat input is applied to the upper electrode 30 from the heater 75 or the plasma. In FIG. 9 and FIG. 10, "openness degree of expansion valve" on the vertical axis represents a degree of openness of the expansion valve 73. The openness degree of the expansion valve of 100% indicates that the expansion valve 73 is completely opened, and the openness degree of the expansion valve of 0% indicates that the expansion valve 73 is closed. In FIG. 9 and FIG. 10, "vaporization pressure" on the vertical axis refers to a vaporization pressure of the coolant in the path 30f. In FIG. 9 and FIG. 10, "vaporization temperature" on the vertical axis refers to a vaporization temperature of the coolant in the path 30f. In FIG. 9 and FIG. 10, "openness degree of flow dividing valve" on the vertical axis indicates a degree of openness of the flow dividing valve 74. The openness degree of the flow dividing valve of 100% indicates that the flow dividing valve 74 is completely opened, and the openness degree of the flow dividing valve of 0% indicates that the flow dividing valve 74 is closed. In FIG. 9 and FIG. 10, "dryness degree" on the vertical axis represents a degree of dryness of the coolant supplied into the path 30f from the chiller unit 70. The dryness degree of 100% indicates that the coolant supplied into the path 30f is saturated vapor. The dryness degree of 0% indicates that the coolant supplied into the path 30f is saturated liquid. In FIG. 9 and FIG. 10, "heat removal amount" on the vertical axis indicates a heat removal amount of the coolant from the upper electrode 30. In FIG. 9 and FIG. 10, "temperature of upper electrode" on the vertical axis indicates the temperature of the upper electrode 30.

The temperature of the upper electrode 30 in the process ST27 may be increased in one or more stages. In the example shown in FIG. 9 and FIG. 10, the temperature of the upper electrode 30 is raised in two stages. In the example shown in FIG. 9, when increasing the temperature of the upper electrode 30 in the first stage, the degree of openness of the expansion valve 73 is increased in a step shape. As shown in FIG. 10, in each stage of the temperature increase of the upper electrode 30 in the process ST27, the degree of openness of the expansion valve 73 may be maintained constant.

In a subsequent process ST28, it is determined whether an absolute value of a difference between the temperature $T_C$ of the upper electrode 30 and the target temperature $T_t$ is smaller than a preset value $T_3$. If it is determined in the process ST28 that the absolute value of the difference between the temperature $T_C$ of the upper electrode 30 and the target temperature $T_t$ is equal to or larger than the preset value $T_3$, the process ST27 is continuously performed. Meanwhile, if it is determined in the process ST28 that the absolute value of the difference between the temperature $T_C$ of the upper electrode 30 and the target temperature $T_t$ is smaller than the preset value $T_3$, a process ST29 is performed. The process ST29 may be performed in parallel with the process ST27.

In the process ST29, a protective film PF is formed on the substrate W within the chamber 10. The protective film PF is formed on the surface of the substrate W to protect a sidewall surface SW (see FIG. 11). The sidewall surface SW is a surface which forms and confines the opening OP, and the opening OP is formed in the film SF through the etching in the process ST24. The protective film PF may be of any kind as long as it is capable of protecting the sidewall surface SW. The protective film PF may be, by way of non-limiting example, a silicon oxide film or a tungsten film.

Figure 12:
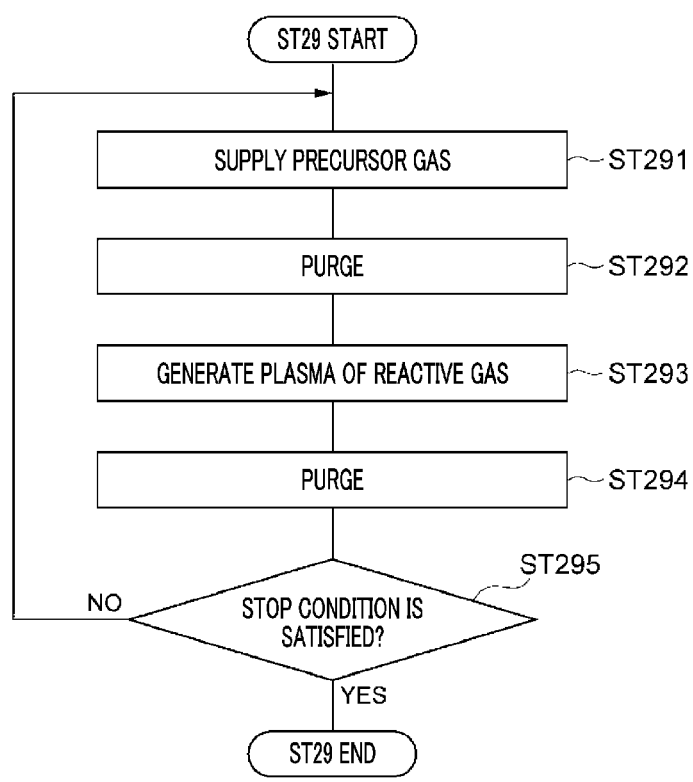
FIG. 12 is a flowchart illustrating an example film forming processing for forming a protective film.

The protective film PF is formed by any of various film forming methods. In the exemplary embodiment, the protective film PF is formed by an atomic layer deposition method. FIG. 12 is a flowchart illustrating an example of a film forming processing for forming the protective film. The film forming processing performed to form the protective film PF in the process ST29 includes a process ST291 to a process ST295.

In the process ST291, a precursor gas is supplied into the internal space 10s. The precursor gas is supplied from the gas source group 40. In case that the protective film PF is the silicon oxide film, the precursor gas is a silicon-containing gas. The silicon-containing gas may be, by way of example, an aminosilane gas. In case that the protective film PF is the tungsten film, the precursor gas is a tungsten-containing gas. The tungsten-containing gas may be, by way of example, a tungsten halide gas. The tungsten halide gas may be, by way of example, but not limitation, a $WF_6$ gas or a $WCl_6$ gas. In the process ST291, the gas exhaust device 50 is controlled such that the pressure within the internal space 10s is set to a preset pressure. A precursor in the precursor gas supplied in the process ST291 adheres to the surface of the substrate W.

In a subsequent process ST292, the internal space 10s is purged. In the process ST292, the gas within the internal space 10s is exhausted by the gas exhaust device 50. In the process ST292, an inert gas may be supplied into the internal space 10s from the gas source group 40. The inert gas may be, by way of non-limiting example, a rare gas.

In a subsequent process ST293, plasma of a reactive gas is generated within the internal space 10s. The reactive gas is supplied from the gas source group 40. In the process ST293, the gas exhaust device 50 is controlled such that the pressure within the internal space 10s is set to a preset pressure. In the process ST293, the first high frequency power is supplied to generate the plasma of the reactive gas. In the process ST293, the second high frequency power may be further supplied.

The reactive gas is a gas containing chemical species which react with the precursor formed on the substrate W. In case that the protective film PF is the silicon oxide film, the reactive gas may be an oxygen-containing gas. The oxygen-containing gas may be, by way of non-limiting example, an oxygen gas ($O_2$ gas). In case that the protective film PF is the tungsten film, the reactive gas may be, but not limited to, a hydrogen gas ($H_2$ gas). Further, hydrogen chemicals from plasma of the hydrogen gas combine with halogen atoms contained in the tungsten halide on the substrate W, so that the halogen atoms are separated from the tungsten halide. As a result, the tungsten film is formed as the protective film PF.

In a subsequent process ST294, the internal space 10s is purged. In the process ST294, the gas within the internal space 10s is exhausted by the gas exhaust device 50. In the process ST294, an inert gas may be supplied into the internal space 10s from the gas source group 40. The inert gas may be, by way of non-limiting example, a rare gas.

In the subsequent process ST295, it is determined whether a stop condition is satisfied. In the process ST295, it is determined that the stop condition is met when a repetition number of a sequence including the process ST291 to the process ST294 reaches a preset number of times. If it is determined in the process ST295 that the stop condition is not satisfied, the sequence is performed again from the process ST291. Meanwhile, if it is determined in the process ST295 that the stop condition is met, the formation of the protective film PF is ended, and the method MT2 proceeds to a process ST30.

In the subsequent process ST30, it is determined whether a stop condition is satisfied. It is determined in the process ST30 that the stop condition is satisfied when a repetition number of the process ST24 and the process ST29 reaches a preset number of times. That is, in the process ST30, it is determined that the stop condition is satisfied when a repetition number of a sequence including the process ST22 to the process ST29 reaches a preset number of times.

If it is determined in the process ST30 that the stop condition is not satisfied, a process ST31 is performed. In the process ST31, the target temperature $T_t$ of the upper electrode 30 is set to the aforementioned temperature $T_L$ which is relatively low. In a subsequent process ST32, the heating of the upper electrode 30 is stopped. In the process ST32, the flow dividing valve 74 is closed. Further, in case that the upper electrode 30 is already heated by the heater 75, the heating of the upper electrode 30 by the heater 75 is stopped. In case that the upper electrode 30 is being heated by the plasma generated within the internal space 10s, the generation of the plasma is stopped. Then, the processing from the process ST22 is performed again.

Figure 11:
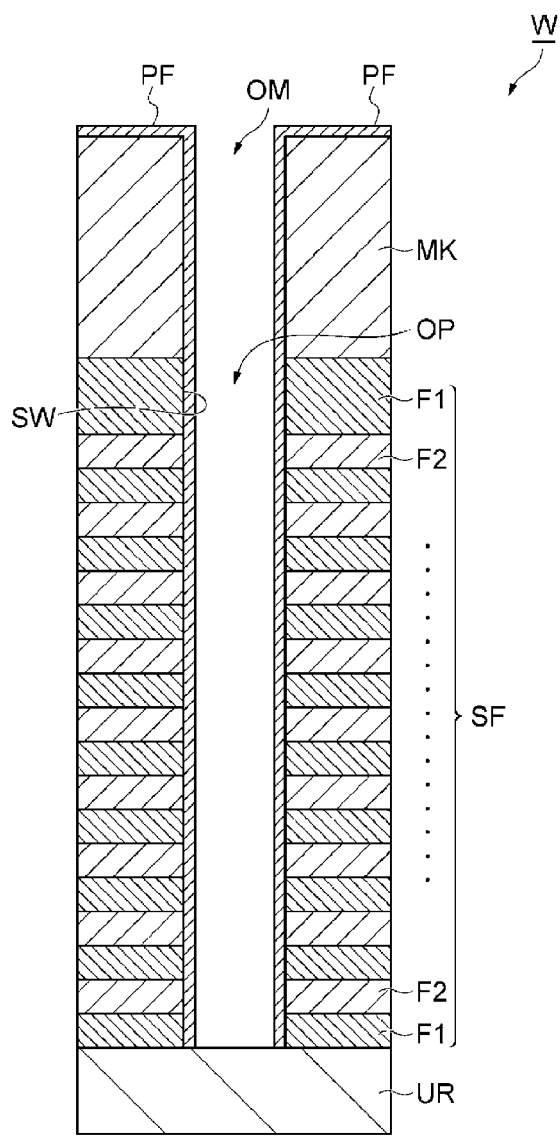
FIG. 11 is a partially enlarged cross sectional view illustrating a state of the example substrate after the etching of the film is ended in the method shown in FIG. 8.

Meanwhile, if it is determined in the process ST30 that the stop condition is satisfied, the etching of the film SF is completed. Upon the completion of the etching of the film SF, the opening OP is formed in the film SF, as illustrated in FIG. 11. The opening OP is continuous with the opening OM of the mask MK to be extended to a top surface of the underlying region UR. After the etching of the film SF is completed, the method MT2 proceeds to a process ST33. In the process ST33, the target temperature $T_t$ of the upper electrode 30 is set to a temperature $T_{H2}$. The temperature $T_{H2}$ is a target temperature the upper electrode 30 needs to reach in a subsequent process ST34 to be described later and is a relatively high temperature.

In the subsequent process ST34, the temperature of the upper electrode 30 is raised to the target temperature $T_t$. The process ST34 is the same as the process ST8 of the method MT1. The process ST34 includes a process ST34a and a process ST34b. The process ST34a is the same as the process ST8a. In the process ST34a, the flow dividing valve 74 is opened. The degree of openness of the flow dividing valve 74 may be previously set. Alternatively, the degree of openness of the flow dividing valve 74 is set to allow the temperature of the upper electrode 30 to be set to the target temperature $T_t$. By way of example, the degree of openness of the flow dividing valve 74 is adjusted to reduce the difference between the temperature $T_C$ of the upper electrode 30 measured by the temperature sensor 79 and the target temperature $T_t$.

The subsequent process ST34b is the same as the process ST8b. In the process ST34b, the upper electrode 30 is heated. The upper electrode 30 may be heated by the heater 75. Alternatively or in addition to the heating by the heater 75, plasma of an inert gas may be generated within the internal space 10s in the process ST34b. When the plasma is generated in the process ST34b, heat from the plasma is transferred to the upper electrode 30, so that the temperature of the upper electrode 30 is increased.

A subsequent process ST35 is the same as the process ST9 of the method MT1. A subsequent process ST36 is the same as the process ST10. In the process ST36, the deposit on the inner wall surface of the chamber 10 is removed by the chemical species from the plasma of the cleaning gas. Further, the process ST36 may be performed along with the process ST34. After the process ST36, the method MT2 is ended.

In the method MT2, during the forming of the protective film PF, the temperature of the upper electrode 30 is set to be high. Accordingly, the possibility that the protective film PF may adhere to the upper electrode 30 is reduced. Further, in the method MT2, it is possible to increase the temperature of the upper electrode 30 in a short time. Furthermore, in the method MT2, the protective film PF is formed on the sidewall surface SW. Accordingly, the opening OP formed by the etching of the film SF can be suppressed from being extended in the horizontal direction (direction orthogonal to the depth direction of the opening OP).

So far, the various exemplary embodiments have been described. However, it should be noted that the exemplary embodiments are not limiting and various changes and modifications may be made. By way of example, the temperature control method of the present disclosure only needs to include, at least, the process of cooling the upper electrode as in the process ST2 and the process of increasing the temperature of the upper electrode as in the process ST8. As an example, the temperature of the upper electrode may be increased as in the process ST8 prior to the maintenance of the plasma processing apparatus and after performing the substrate processing in the state that the upper electrode 30 is cooled.

Further, the plasma processing apparatus used in the method MT1 and the method MT2 may be any of various types as long as it is a capacitively coupled plasma processing apparatus in which an upper electrode is capable of generating the negative bias voltage and the upper electrode can be cooled.

Figure 13:
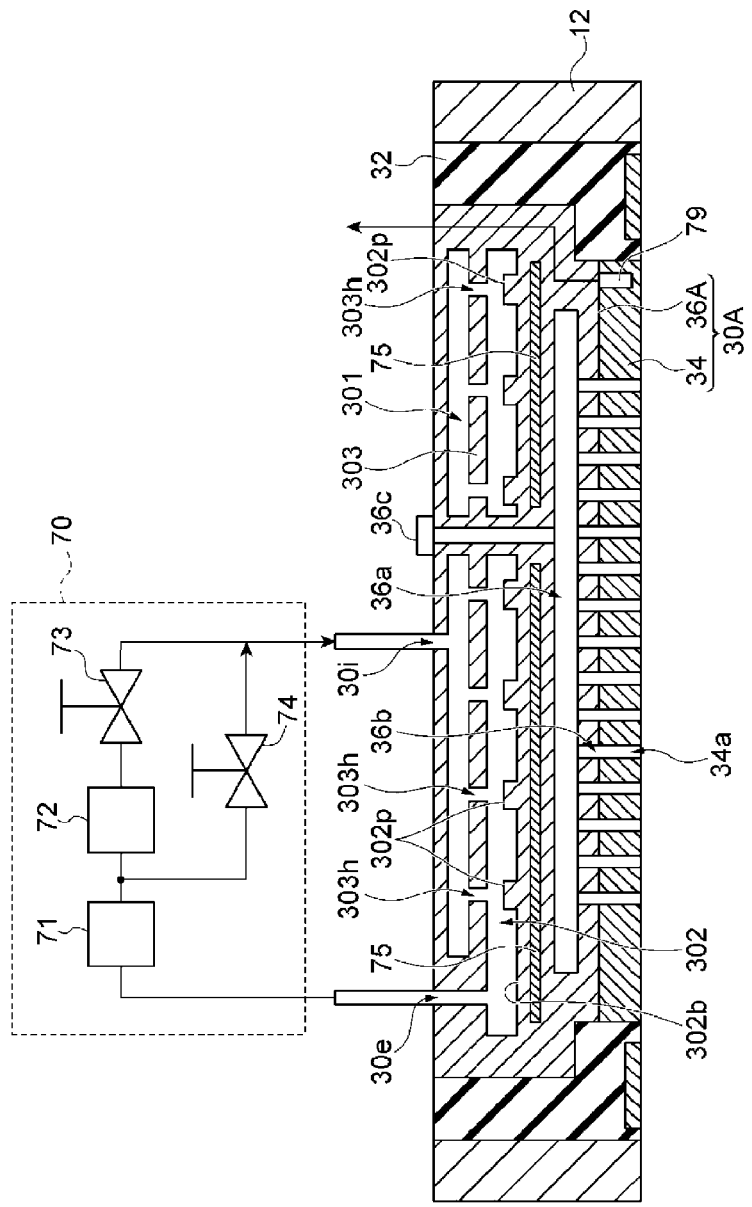
FIG. 13 is a diagram illustrating an example of an upper electrode of a plasma processing apparatus which can be used to perform plasma processing methods according to various exemplary embodiments.

In addition, the plasma processing apparatus 1 may be equipped with an upper electrode 30A shown in FIG. 13, instead of the upper electrode 30. FIG. 13 is a diagram illustrating an example of an upper electrode of the plasma processing apparatus which can be used to perform the temperature control methods according to the various exemplary embodiments described above. The upper electrode 30A includes the ceiling plate 34 and a supporting body 36A. The supporting body 36A is different from the supporting body 36 of the upper electrode 30. That is, the upper electrode 30A is different from the upper electrode 30 in the structure of the supporting body.

Like the supporting body 36, the supporting body 36A has the gas diffusion space 36a and the gas holes 36b. The path 30f is not formed in the supporting body 36A. The supporting body 36A has a first space 301 and a second space 302 formed therein. The first space 301 is formed and extended above the second space 302. When viewed from the top, each of the first space 301 and the second space 302 has a substantially circular plan shape. A wall portion 303 is extended between the first space 301 and the second space 302. The wall portion 303 is extended in the horizontal direction.

The first space 301 is connected to the inlet 30i, and the output port of the chiller unit 70 is connected to the inlet 30i. A path which provides the inlet 30i is extended upwards from the first space 301 within the supporting body 36A. That is, the coolant outputted from the chiller unit 70 is supplied into the first space 301 from above.

A bottom surface 302b which forms and confines the second space 302 is provided with a multiple number of protrusions 302p. Each of the multiple number of protrusions 302p is projected from a peripheral region of the bottom surface 302b. The protrusions 302p are dispersed two-dimensionally within the bottom surface 302b. The wall portion 303 is provided with multiple through holes 303h. Each of the multiple through holes 303h is extended in the vertical direction to allow the first space 301 and the second space 302 to communicate with each other. A lower end of each of the multiple through holes 303h faces a corresponding one of the multiple number of protrusions 302p. As the coolant supplied into the first space 301 from the chiller unit 70 is discharged toward the multiple number of protrusions 302p via the multiple through holes 303h, the coolant is supplied into the second space 302.

The second space 302 is connected to the outlet 30e, and the output 30e is connected to the return port of the chiller unit 70. A path which provides the outlet 30e is extended upwards from the second space 302 within the supporting body 36A. The coolant which is vaporized after being supplied into the second space 302 is exhausted upwards from the second space 302 to be returned back into the chiller unit 70.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A temperature control method of an upper electrode of a capacitively coupled plasma processing apparatus, the temperature control method comprising:
   cooling the upper electrode; and
   increasing a temperature of the upper electrode,
   wherein a path having an inlet and an outlet is formed within the upper electrode, and the upper electrode constitutes an evaporator,
   a compressor, a condenser and an expansion valve are connected in sequence between the outlet and the inlet of the path,
   a flow dividing valve is connected between an output of the compressor and the inlet to bypass the condenser and the expansion valve,
   in the cooling of the upper electrode, a coolant is supplied into the path via the compressor, the condenser and the expansion valve, and
   in the increasing of the temperature of the upper electrode, the flow dividing valve is opened and the upper electrode is heated.

2. The temperature control method of claim 1,
   wherein, in the increasing of the temperature of the upper electrode, the upper electrode is heated by a heater.

3. The temperature control method of claim 1,
   wherein, in the increasing of the temperature of the upper electrode, the upper electrode is heated by heat from plasma which is generated within a chamber of the plasma processing apparatus.

4. The temperature control method of claim 1, further comprising:
   etching a film of a substrate, which is placed on a supporting table provided within a chamber and provided with a lower electrode, by plasma generated in the chamber of the plasma processing apparatus;
   generating a negative bias voltage in the upper electrode during the etching of the film; and
   generating plasma of a cleaning gas within the chamber to remove a deposit which is generated in the etching of the film and adheres to an inner wall surface of the chamber,
   wherein the etching of the film of the substrate is performed during the cooling of the upper electrode, and
   the increasing of the temperature of the upper electrode is performed prior to or during the generating of the plasma of the cleaning gas.

5. The temperature control method of claim 1, further comprising:
   etching a film of a substrate, which is placed on a supporting table provided within a chamber and provided with a lower electrode, by plasma generated in the chamber of the plasma processing apparatus;
   generating a negative bias voltage in the upper electrode during the etching of the film; and
   forming a protective film on a surface of the substrate,
   wherein the etching of the film of the substrate is performed during the cooling of the upper electrode,
   the increasing of the temperature of the upper electrode is performed prior to or during the forming of the protective film, and
   the etching of the film of the substrate and the forming of the protective film are alternately performed.

6. The temperature control method of claim 4,
   wherein the film of the substrate contains silicon, and
   in the etching of the film of the substrate, the plasma is generated from a processing gas including carbon, hydrogen and fluorine.

7. The temperature control method of claim 6,
   wherein the film of the substrate is a multilayered film comprising multiple silicon oxide films and multiple silicon nitride films alternately stacked on top of each other.

8. The temperature control method of claim 5,
   wherein the film of the substrate contains silicon, and
   in the etching of the film of the substrate, the plasma is generated from a processing gas including carbon, hydrogen and fluorine.

9. The temperature control method of claim 8,
   wherein the film of the substrate is a multilayered film comprising multiple silicon oxide films and multiple silicon nitride films alternately stacked on top of each other.

10. The temperature control method of claim 2, further comprising:
    etching a film of a substrate, which is placed on a supporting table provided within a chamber and provided with a lower electrode, by plasma generated in the chamber of the plasma processing apparatus;
    generating a negative bias voltage in the upper electrode during the etching of the film; and
    generating plasma of a cleaning gas within the chamber to remove a deposit which is generated in the etching of the film and adheres to an inner wall surface of the chamber,
    wherein the etching of the film of the substrate is performed during the cooling of the upper electrode, and
    the increasing of the temperature of the upper electrode is performed prior to or during the generating of the plasma of the cleaning gas.

11. The temperature control method of claim 2, further comprising:
    etching a film of a substrate, which is placed on a supporting table provided within a chamber and provided with a lower electrode, by plasma generated in the chamber of the plasma processing apparatus;
    generating a negative bias voltage in the upper electrode during the etching of the film; and
    forming a protective film on a surface of the substrate,
    wherein the etching of the film of the substrate is performed during the cooling of the upper electrode,
    the increasing of the temperature of the upper electrode is performed prior to or during the forming of the protective film, and
    the etching of the film of the substrate and the forming of the protective film are alternately performed.

12. The temperature control method of claim 10,
    wherein the film of the substrate contains silicon, and
    in the etching of the film of the substrate, the plasma is generated from a processing gas including carbon, hydrogen and fluorine.

13. The temperature control method of claim 11,
    wherein the film of the substrate contains silicon, and
    in the etching of the film of the substrate, the plasma is generated from a processing gas including carbon, hydrogen and fluorine.

14. The temperature control method of claim 3, further comprising:
    etching a film of a substrate, which is placed on a supporting table provided within a chamber and provided with a lower electrode, by plasma generated in the chamber of the plasma processing apparatus;

generating a negative bias voltage in the upper electrode during the etching of the film; and generating plasma of a cleaning gas within the chamber to remove a deposit which is generated in the etching of the film and adheres to an inner wall surface of the chamber, wherein the etching of the film of the substrate is performed during the cooling of the upper electrode, and the increasing of the temperature of the upper electrode is performed prior to or during the generating of the plasma of the cleaning gas.

15. The temperature control method of claim 3, further comprising:

etching a film of a substrate, which is placed on a supporting table provided within a chamber and provided with a lower electrode, by plasma generated in the chamber of the plasma processing apparatus;

generating a negative bias voltage in the upper electrode during the etching of the film; and forming a protective film on a surface of the substrate, wherein the etching of the film of the substrate is performed during the cooling of the upper electrode, the increasing of the temperature of the upper electrode is performed prior to or during the forming of the protective film, and the etching of the film of the substrate and the forming of the protective film are alternately performed.

16. The temperature control method of claim 14, wherein the film of the substrate contains silicon, and in the etching of the film of the substrate, the plasma is generated from a processing gas including carbon, hydrogen and fluorine.

17. The temperature control method of claim 15, wherein the film of the substrate contains silicon, and in the etching of the film of the substrate, the plasma is generated from a processing gas including carbon, hydrogen and fluorine.

* * * * *